US010461719B2

(12) United States Patent
Choy et al.

(10) Patent No.: US 10,461,719 B2
(45) Date of Patent: Oct. 29, 2019

(54) ACOUSTIC RESONATOR STRUCTURE HAVING AN ELECTRODE WITH A CANTILEVERED PORTION

(71) Applicant: Avago Technologies General IP (Singapore) Pte. Ltd., Singapore (SG)

(72) Inventors: John Choy, Westminster, CO (US); Chris Feng, Fort Collins, CO (US); Phil Nikkel, Loveland, CO (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 214 days.

(21) Appl. No.: 15/371,920

(22) Filed: Dec. 7, 2016

(65) Prior Publication Data
US 2017/0093368 A1     Mar. 30, 2017

Related U.S. Application Data

(63) Continuation of application No. 14/165,301, filed on Jan. 27, 2014, now Pat. No. 9,520,856.

(51) Int. Cl.
| H03H 9/17 | (2006.01) |
| H03H 9/02 | (2006.01) |
| H03H 9/13 | (2006.01) |
| H03H 9/54 | (2006.01) |
| H03H 9/70 | (2006.01) |

(52) U.S. Cl.
CPC ........ *H03H 9/171* (2013.01); *H03H 9/02118* (2013.01); *H03H 9/02149* (2013.01); *H03H 9/132* (2013.01); *H03H 9/173* (2013.01); *H03H 9/54* (2013.01); *H03H 9/706* (2013.01)

(58) Field of Classification Search
CPC ........... H03H 9/02118; H03H 9/02149; H03H 9/132; H03H 9/171; H03H 9/173; H03H 9/175; H03H 9/54; H03H 9/706
USPC .................................................. 333/187, 189
See application file for complete search history.

(56) References Cited

U.S. PATENT DOCUMENTS

| 4,011,472 A * | 3/1977 | Feng ..................... B06B 1/0625 |
| | | 310/328 |
| 6,287,894 B1 * | 9/2001 | Sawin ............... H01L 23/49822 |
| | | 257/E21.511 |
| 7,268,647 B2 | 9/2007 | Sano et al. |
| 7,602,102 B1 * | 10/2009 | Barber ..................... H03H 3/02 |
| | | 310/320 |
| 8,084,919 B2 * | 12/2011 | Nishihara .......... H03H 9/02118 |
| | | 310/320 |
| 8,248,185 B2 | 8/2012 | Choy et al. |

(Continued)

FOREIGN PATENT DOCUMENTS

JP     2006020277 A     1/2006

OTHER PUBLICATIONS

Non-Final Office Action dated Nov. 10, 2015 for U.S. Appl. No. 14/165,301, 58 pgs.

(Continued)

*Primary Examiner* — Barbara Summons

(57) ABSTRACT

An acoustic resonator comprises a first electrode and second electrode comprising a plurality of sides. At least one of the sides of the second electrode comprises a cantilevered portion. A piezoelectric layer is disposed between the first and second electrodes. A bridge disposed adjacent to one of the sides of the second electrode.

20 Claims, 14 Drawing Sheets

(56) References Cited

U.S. PATENT DOCUMENTS

| | | | | |
|---|---|---|---|---|
| 8,283,835 | B2* | 10/2012 | Metzger | H03H 3/02 |
| | | | | 310/313 A |
| 8,902,023 | B2* | 12/2014 | Choy | H03H 9/02118 |
| | | | | 310/322 |
| 9,520,856 | B2* | 12/2016 | Choy | H03H 9/02118 |
| 9,673,778 | B2* | 6/2017 | Feng | H03H 9/02118 |
| 2005/0269904 | A1 | 12/2005 | Oka | |
| 2006/0071736 | A1* | 4/2006 | Ruby | H03H 3/02 |
| | | | | 333/187 |
| 2007/0115078 | A1* | 5/2007 | Sano | H03H 3/02 |
| | | | | 333/187 |

OTHER PUBLICATIONS

Response to Non-Final Office Action dated Feb. 10, 2016 for U.S. Appl. No. 14/165,301, 17 pgs.

Applicant Initiated Interview Summary dated Feb. 17, 2016 for U.S. Appl. No. 14/165,301, pp. 3.

Examiner Interview Summary dated Mar. 16, 2016 for U.S. Appl. No. 14/165,301, 2 pgs.

\* cited by examiner

ACOUSTIC RESONATOR STRUCTURE HAVING AN ELECTRODE WITH A CANTILEVERED PORTION

CROSS-REFERENCE TO RELATED APPLICATIONS

The present application is a continuation of and claims priority under 35 U.S.C. § 120 from U.S. patent application Ser. No. 14/165,301 (now U.S. Pat. No. 9,520,856) to John Choy, et al. and filed on Jan. 27, 2014, which is a continuation of and claims priority under 35 U.S.C. § 120 from U.S. patent application Ser. No. 12/626,035 to John Choy, et al, and filed on Nov. 25, 2009 (now U.S. Pat. No. 8,902,023). The entire disclosures of the parent patent applications and of the parent patents are specifically incorporated herein by reference.

BACKGROUND

In many electronic applications, electrical resonators are used. For example, in many wireless communications devices, radio frequency (rf) and microwave frequency resonators are used as filters to improve reception and transmission of signals. Filters typically include inductors and capacitors, and more recently resonators.

As will be appreciated, it is desirable to reduce the size of components of electronic devices. Many known filter technologies present a barrier to overall system miniaturization. With the need to reduce component size, a class of resonators based on the piezoelectric effect has emerged. In piezoelectric-based resonators, acoustic resonant modes are generated in the piezoelectric material. These acoustic waves are converted into electrical waves for use in electrical applications.

One type of piezoelectric resonator is a Film Bulk Acoustic Resonator (FBAR). The FBAR has the advantage of small size and lends itself to Integrated Circuit (IC) manufacturing tools and techniques. The FBAR includes an acoustic stack comprising, inter alia, a layer of piezoelectric material disposed between two electrodes. Acoustic waves achieve resonance across the acoustic stack, with the resonant frequency of the waves being determined by the materials in the acoustic stack.

FBARs are similar in principle to bulk acoustic resonators such as quartz, but are scaled down to resonate at GHz frequencies. Because the FBARs have thicknesses on the order of microns and length and width dimensions of hundreds of microns, FBARs beneficially provide a comparatively compact alternative to known resonators.

Desirably, the bulk acoustic resonator excites only thickness-extensional (TE) modes, which are longitudinal mechanical waves having propagation (k) vectors in the direction of propagation. The TE modes desirably travel in the direction of the thickness (e.g., z-direction) of the piezoelectric layer.

Unfortunately, in addition to the desired TE modes there are lateral modes, known as Rayleigh-Lamb modes, generated in the acoustic stack as well. The Rayleigh-Lamb modes are mechanical waves having k-vectors that are perpendicular to the direction of TE modes, the desired modes of operation. These lateral modes travel in the areal dimensions (x, y directions of the present example) of the piezoelectric material. Among other adverse effects, lateral modes deleteriously impact the quality (Q) factor of an FBAR device. In particular, the energy of Rayleigh-Lamb modes is lost at the interfaces of the FBAR device. As will be appreciated, this loss of energy to spurious modes is a loss in energy of desired longitudinal modes, and ultimately a degradation of the Q-factor.

What is needed, therefore, is an acoustic resonator that overcomes at least the known shortcomings described above.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DEFINED TERMINOLOGY

Figure 1A:
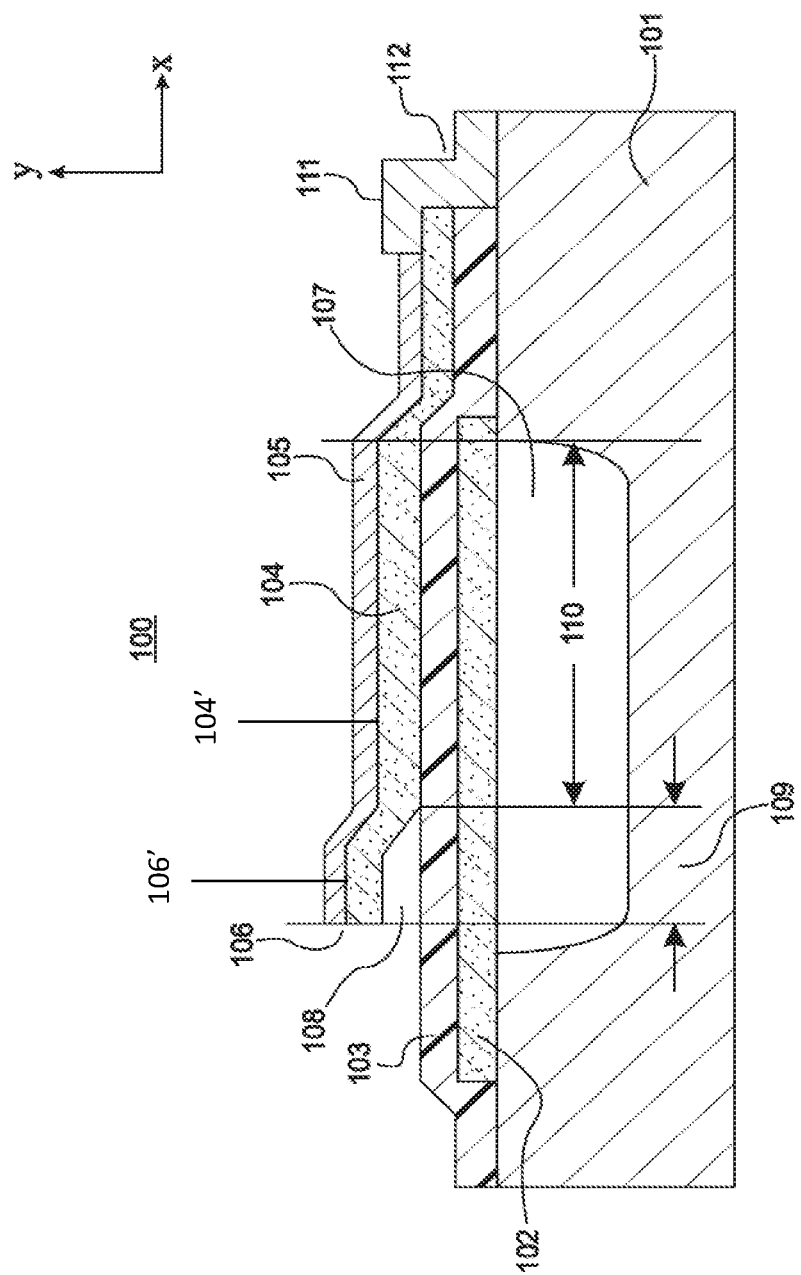
FIG. 1A shows a cross-sectional view of an acoustic resonator in accordance with a representative embodiment.

It is to be understood that the terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to with acceptable limits or degree. For example, 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

DETAILED DESCRIPTION

In the following detailed description, for purposes of explanation and not limitation, specific details are set forth in order to provide a thorough understanding of illustrative embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the illustrative embodiments. Such methods and apparatuses are clearly within the scope of the present teachings.

Generally, it is understood that the drawings and the various elements depicted therein are not drawn to scale. Further, relative terms, such as "above," "below," "top," "bottom," "upper" and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element.

FIG. 1A is a cross-sectional view along the line 1B-1B of an acoustic resonator 100 in accordance with a representative embodiment. Illustratively, the acoustic resonator 100 comprises an FBAR. The acoustic resonator 100 comprises a substrate 101, a first electrode 102 disposed beneath a piezoelectric layer 103, which comprises a first surface in contact with a first electrode 102 and a second surface in contact with a second electrode 104. An optional passivation layer 105 is provided over the second electrode 104. A cantilevered portion 106 of the second electrode 104 is provided on at least one side of the second electrode 104. The cantilevered portion 106 may also be referred to as a 'wing.'

As depicted in FIG. 1A, the second electrode 104 comprises a first surface 104'. As can be seen, the first surface 104' is disposed substantially at a first height (y-dimension in the coordinate system depicted). Similarly, the cantilevered portion 106 comprises a second surface 106'. The second surface 106' is disposed substantially at a second height (again, y-dimension in the coordinate system depicted). The second height is higher than the first height. Thus, the second surface 106' is raised up relative to the first surface 104'.

The acoustic resonator 100 may be fabricated according to known semiconductor processing methods and using known materials. Illustratively, the acoustic resonator 100 may be fabricated according to the teachings of commonly owned U.S. Pat. Nos. 5,587,620; 5,873,153; 6,384,697; 6,507,983; and 7,275,292 to Ruby, et al.; and U.S. Pat. No. 6,828,713 to Bradley, et al. The disclosures of these patents are specifically incorporated herein by reference. It is emphasized that the methods and materials described in these patents are representative and other methods of fabrication and materials within the purview of one of ordinary skill in the art are contemplated.

When connected in a selected topology, a plurality of acoustic resonators 100 can act as an electrical filter. For example, the acoustic resonators 100 may be arranged in a ladder-filter arrangement, such as described in U.S. Pat. No. 5,910,756 to Ella, and U.S. Pat. No. 6,262,637 to Bradley, et al., the disclosures of which are specifically incorporated herein by reference. The electrical filters may be used in a number of applications, such as in duplexers.

The first and second electrodes 102, 104 each comprise an electrically conductive material (e.g., molybdenum (Mo)) and provide an oscillating electric field in the y-direction of the coordinate system shown (i.e., the direction of the thickness of the substrate 101). In the illustrative embodiment described presently, the y-axis is the axis for the TE (longitudinal) mode(s) for the resonator. In a representative embodiment, the piezoelectric layer 103 and first and second electrodes 102,104 are suspended over a cavity 107 formed by selective etching of the substrate 101. The cavity 107 may be formed by a number of known methods, for example as described in referenced commonly owned U.S. Pat. No. 6,384,697 to Ruby, et al. Accordingly, the acoustic resonator 100 is a mechanical resonator, which can be electrically coupled via the piezoelectric layer 103. Other configurations that foster mechanical resonance by FBARs are contemplated. For example, the acoustic resonator 100 can be located over an acoustic mirror, such as a mismatched acoustic Bragg reflector (not shown in FIG. 1A) formed in or on the substrate 101. FBARs provided over an acoustic mirror are sometimes referred to as solid mount resonators (SMRs) and, for example, may be as described in U.S. Pat. No. 6,107,721 to Lakin, the disclosure of which is specifically incorporated into this disclosure by reference in its entirety.

The cantilevered portion 106 of the second electrode 104 extends over a gap 108, which illustratively comprises air. In a representative embodiment, a sacrificial layer (not shown) is deposited by known technique over the first electrode 102 and a portion of the piezoelectric layer 103. The second electrode 104 and passivation layer 105 are provided over the sacrificial layer. Illustratively, the sacrificial material comprises phosphosilicate glass (PSG), which illustratively comprises 8% phosphorous and 92% silicon dioxide. After the formation of the second electrode 104 and passivation layer 105, the sacrificial layer is etched away illustratively with hydrofluoric acid leaving the cantilevered portion 106. In a representative embodiment, the sacrificial layer provided to form the cantilevered portion 106 and the sacrificial layer provided to form the cavity 107 are removed in the same process step.

Notably, rather than air, the gap 108 may comprise other materials including low acoustic impedance materials, such as carbon (C) doped $SiO_2$, which is also referred as Black-diamond; or dielectric resin commercially known as SiLK™; or benzocyclobutene (BCB). Such low acoustic impedance materials may be provided in the gap 108 by known methods. The low acoustic impedance material may be provided after removal of sacrificial material used to form the gap 108, or may be used instead of the sacrificial material in the gap 108, and not removed.

The region of contacting overlap of the first and second electrodes 102, 104, the piezoelectric layer 103 and the cavity 107, or other reflector (e.g., Bragg reflector (not shown)) is referred to as an active area 110 of the acoustic resonator 100. By contrast, an inactive area of the acoustic resonator comprises a region of overlap between first electrode 102 or second electrode 104, or both, and the piezoelectric layer 103 not disposed over the cavity 107, or other suspension structure, or acoustic mirror. As described more fully in the parent application, it is beneficial to the performance of the acoustic resonator 100 to reduce the area of the inactive region of the acoustic resonator 100 to the extent practical.

The cantilevered portion 106 extends beyond an edge of the active area 110 by a width 109 as shown. An electrical contact 111 is connected to a signal line (not shown) and electronic components (not shown) selected for the particular application of the acoustic resonator 100. This portion of the acoustic resonator 100 comprises an interconnection side 112 of the acoustic resonator 100. As will become clearer as the present description continues, the interconnection side 112 of the second electrode 104 to which the electrical contact 111 is made does not comprise a cantilevered portion. By contrast, one or more non-connecting sides of the acoustic resonator 100 may comprise cantilevered portions 106 that extend beyond the edge of the active area 110.

Figure 1B:
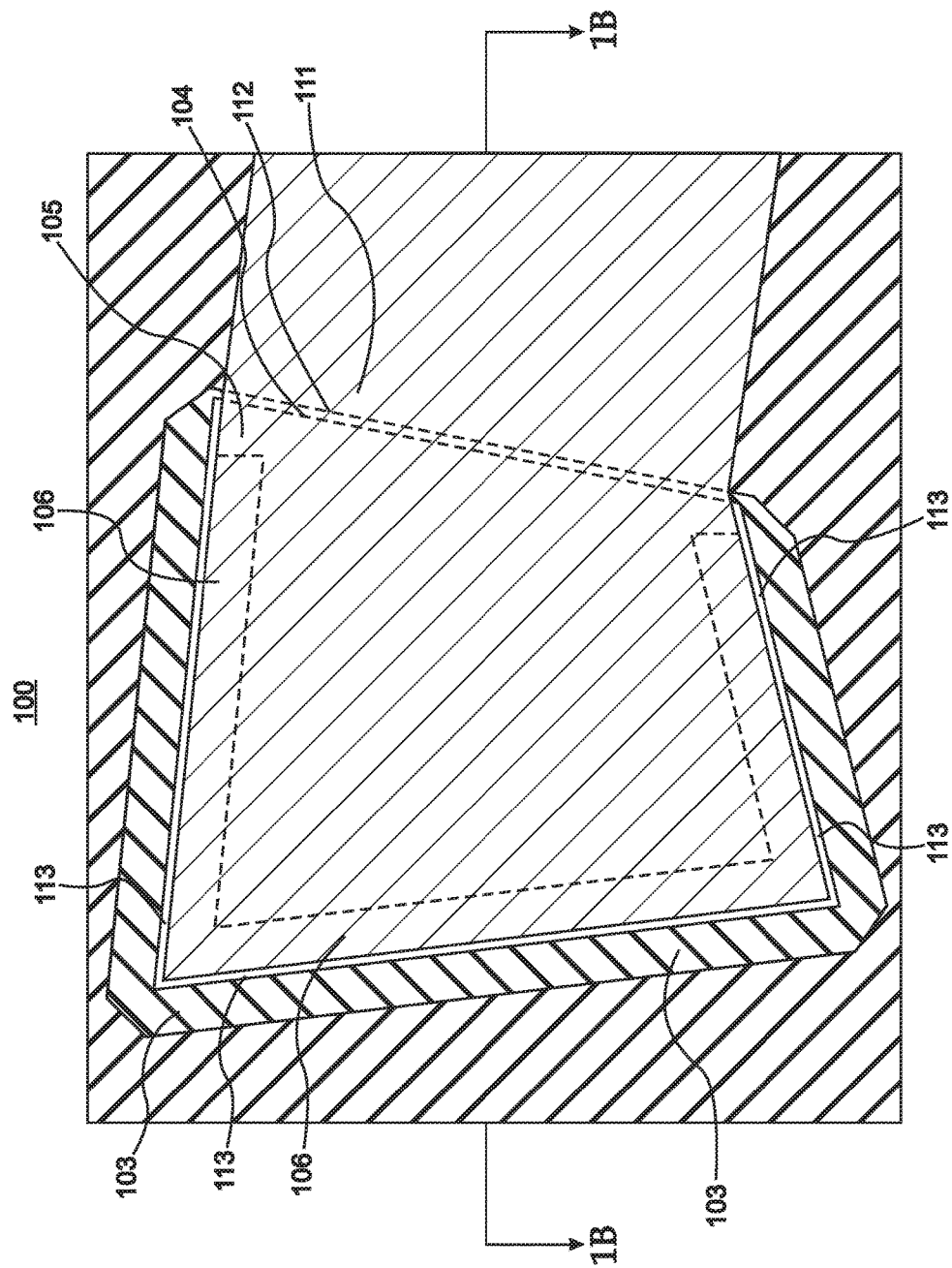
FIG. 1B shows a top view of an acoustic resonator in accordance with a representative embodiment.

FIG. 1B shows a top view of the acoustic resonator 100 shown in cross-sectional view in FIG. 1A and in accordance with a representative embodiment. The acoustic resonator 100 also comprises the second electrode 104 with the optional passivation layer 105 disposed thereover. The second electrode 104 of the present embodiment is illustratively apodized to reduce acoustic losses. Further details of the use of apodization in acoustic resonators may be found in commonly owned U.S. Pat. No. 6,215,375 to Larson III, et al; or in commonly owned U.S. Patent Application Publication 20070279153 entitled "Piezoelectric Resonator Structures and Electrical Filters" filed May 31, 2006, to Richard C. Ruby. The disclosures of this patent and patent application publication are specifically incorporated herein by reference in their entirety.

The second electrode 104 comprises non-connecting sides 113 and interconnection side 112. In a representative embodiment, cantilevered portions 106 are provided along each non-contacting side 113 and have the same width. This is merely illustrative, and it is contemplated that at least one side 113, but not all comprise a cantilevered portion 106. Furthermore, it is contemplated that the second electrode 104 comprises more or fewer than four sides as shown. For example, a pentagonal-shaped second electrode is contemplated comprising four sides with cantilevered portions on one or more of the sides, and the fifth side providing the interconnection side. In a representative embodiment, the shape of the first electrode 102 is substantially identical to the shape of the second electrode 104. Notably, the first electrode 102 may comprise a larger area than the second electrode 104, and the shape of the first electrode 102 may be different than the shape of the second electrode 104.

The fundamental mode of the acoustic resonator 100 is the longitudinal extension mode or "piston" mode. This mode is excited by the application of a time-varying voltage to the two electrodes at the resonant frequency of the acoustic resonator 100. The piezoelectric material converts energy in the form of electrical energy into mechanical energy. In an ideal FBAR having infinitesimally thin electrodes, resonance occurs when the applied frequency is equal to the velocity of sound of the piezoelectric medium divided by twice the thickness of the piezoelectric medium: $f=v_{ac}/(2*T)$, where T is the thickness of the piezoelectric medium and $v_{ac}$ is the acoustic phase velocity. For resonators with finite thickness electrodes, this equation is modified by the weighted acoustic velocities and thicknesses of the electrodes.

A quantitative and qualitative understanding of the Q of a resonator may be obtained by plotting on a Smith Chart the ratio of the reflected energy to applied energy as the frequency is varied for the case in which one electrode is connected to ground and another to signal, for an FBAR resonator with an impedance equal to the system impedance at the resonant frequency. As the frequency of the applied energy is increased, the magnitude/phase of the FBAR resonator sweeps out a circle on the Smith Chart. This is referred to as the Q-circle. Where the Q-circle first crosses the real axes (horizontal axes), this corresponds to the series resonance frequency $f_s$. The real impedance (as measured in Ohms) is $R_s$. As the Q-circle continues around the perimeter of the Smith chart, it again crosses the real axes. The second point at which the Q circle crosses the real axis is labeled $f_p$, the parallel or anti-resonant frequency of the FBAR. The real impedance at $f_p$ is $R_p$.

Often it is desirable to minimize $R_s$ while maximizing $R_p$. Qualitatively, the closer the Q-circle "hugs" the outer rim of the Smith chart, the higher the Q-factor of the device. The Q-circle of an ideal lossless resonator would have a radius of one and would be at the edge of the Smith chart. However, as noted above, there are energy losses that impact the Q-factor of the device. For instance, and in addition to the sources of acoustic losses mentioned above, Rayleigh-Lamb (lateral or spurious) modes are in the x,y dimensions of the piezoelectric layer 103. These lateral modes are due to interfacial mode conversion of the longitudinal mode traveling in the z-direction; and due to the creation of non-zero propagation vectors, $k_x$ and $k_y$, for both the TE mode and the various lateral modes (e.g., the S0 (symmetric) mode and the zeroth and (asymmetric) modes, A0 and A1), which are due to the difference in effective velocities between the regions where electrodes are disposed and the surrounding regions of the resonator where there are no electrodes. At a specific frequency, the acoustic wave length of an acoustic resonator is determined by v/f, where v is acoustic velocity and f is frequency. It is believed that periodicity of Qp (i.e., the position of maxima and minima as a function of the width of the cantilevered portion 106) is related to the acoustic wave length. At a maxima of Qp, the vibration of the wing 106 is comparatively far from its mechanical resonance; while at a minima mechanical resonance of the cantilevered portion 106 occurs. This phenomenon can be appreciated from a review of FIG. 2A below, for example: as frequency decreases, acoustic wave length increases, and the width of the cantilevered portion 106 at a maxima increases accordingly.

Regardless of their source, the lateral modes are parasitic in many resonator applications. For example, the parasitic lateral modes couple at the perimeter of the resonator and remove energy available for the longitudinal modes and thereby reduce the Q-factor of the resonator device. Notably, as a result of parasitic lateral modes and other acoustic losses sharp reductions in Q can be observed on a Q-circle of the Smith Chart of the $S_{11}$ parameter. These sharp reductions in Q-factor are known as "rattles" or "loop-de-loops," which are shown and described below.

The cantilevered portion(s) 106 of the representative embodiments provide a change in the acoustic impedance at the boundary of the active area 110 of the acoustic resonator 100. As a result, reflections of lateral modes at the boundary are promoted. In a representative embodiment, the boundary of the active area 110 of the acoustic resonator and the cantilevered portion 106 is solid (electrodes and piezoelectric layer) and air, which presents a comparatively large impedance mismatch and a comparatively high reflection coefficient. As a result, lateral modes are comparatively highly reflected, which improves the Q-factor by two mechanisms. First, because the reflected lateral modes are not transmitted, their energy is not lost. Improving the losses by reducing transmission of lateral modes outside the active area 110 of the acoustic resonator 100 can increase the Q-factor of the acoustic resonator 100. Second, a portion of the reflected lateral modes is converted into desired longitudinal modes. The greater the wave energy is in longitudinal modes, the higher the Q-factor. As a result, the cantilevered portion(s) 106 of the acoustic resonator 100 enhances the Q-factor of both the parallel and the series resonance (i.e., $Q_p$ and $Q_s$).

Figure 1C:
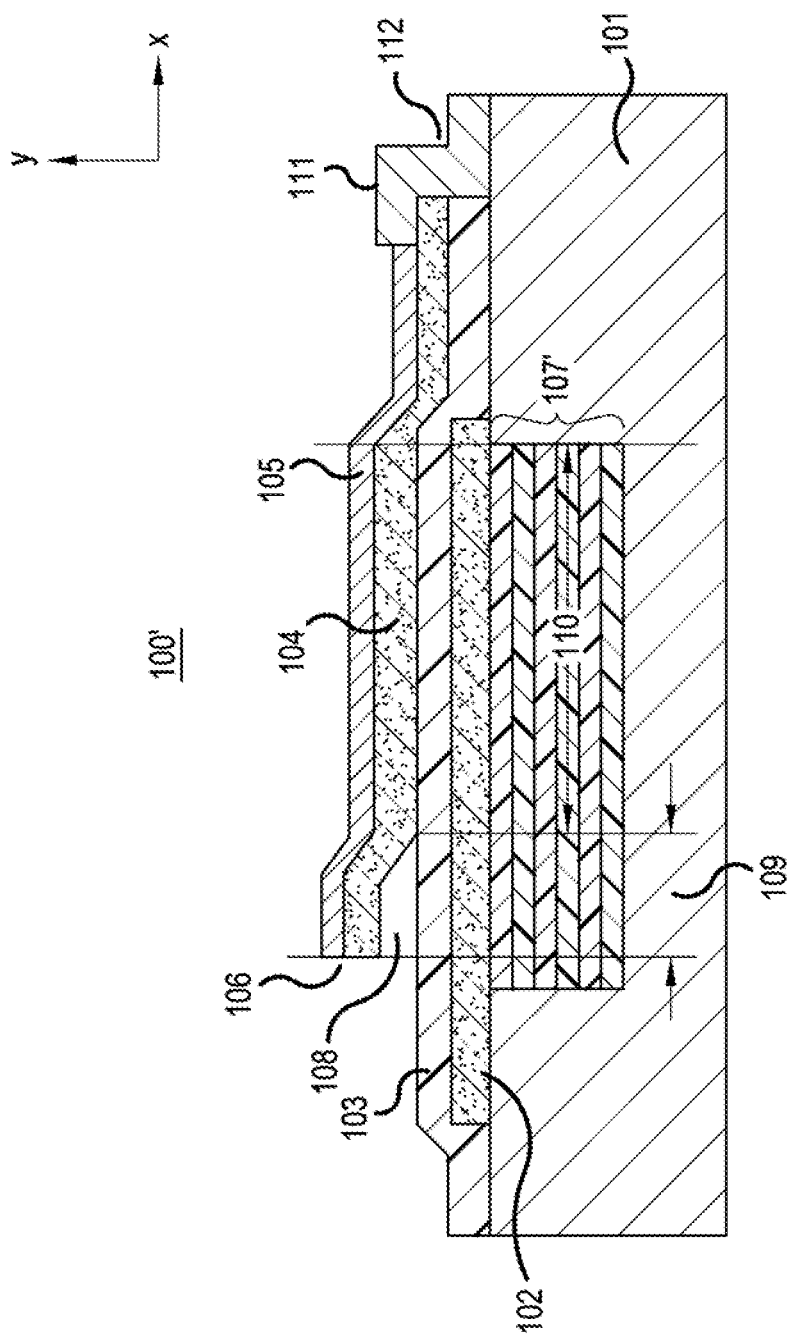
FIG. 1C shows a cross-sectional view of an acoustic resonator in accordance with a representative embodiment.

FIG. 1C is a cross-sectional view of acoustic resonator 100' in accordance with a representative embodiment. The acoustic resonator 100' comprises substrate 101, first electrode 102 disposed beneath a piezoelectric layer 103, which comprises a first surface in contact with a first electrode 102 and a second surface in contact with second electrode 104. Optional passivation layer 105 is provided over the second electrode 104. Cantilevered portion 106 of the second electrode 104 is provided on at least one side of the second electrode 104. As noted above, the cantilevered portion 106 may also be referred to as a 'wing.'

As noted above acoustic resonator 100' may be fabricated according to known semiconductor processing methods and using known materials. Illustratively, the acoustic resonator 100' may be fabricated according to the teachings of commonly owned U.S. Pat. Nos. 5,587,620; 5,873,153; 6,384,697; 6,507,983; and 7,275,292 to Ruby, et al.; and U.S. Pat. No. 6,828,713 to Bradley, et al.

When connected in a selected topology, a plurality of acoustic resonators 100' can act as an electrical filter. Again, by way of example, the acoustic resonators 100' may be arranged in a ladder-filter arrangement, such as described in U.S. Pat. No. 5,910,756 to Ella, and U.S. Pat. No. 6,262,637 to Bradley, et al. The electrical filters may be used in a number of applications, such as in duplexers.

The first and second electrodes 102, 104 each comprise an electrically conductive material (e.g., molybdenum (Mo)) and provide an oscillating electric field in the y-direction of the coordinate system shown (i.e., the direction of the thickness of the substrate 101). In the illustrative embodiment described presently, the y-axis is the axis for the TE (longitudinal) mode(s) for the resonator. In a representative embodiment, the piezoelectric layer 103 and first and second electrodes 102,104 are suspended over an acoustic mirror 107', such as a mismatched acoustic Bragg reflector formed in or on the substrate 101. FBARs provided over an acoustic mirror are sometimes referred to as solid mount resonators (SMRs) and, for example, may be as described in above-referenced U.S. Pat. No. 6,107,721 to Lakin. Accordingly, the acoustic resonator 100' is a mechanical resonator, which can be electrically coupled via the piezoelectric layer 103.

The cantilevered portion 106 of the second electrode 104 extends over gap 108, which illustratively comprises air. As noted above, in a representative embodiment, a sacrificial layer (not shown) is deposited by known technique over the first electrode 102 and a portion of the piezoelectric layer 103. The second electrode 104 and passivation layer 105 are provided over the sacrificial layer. Again, by way of illustration, the sacrificial material comprises phosphosilicate glass (PSG), which illustratively comprises 8% phosphorous and 92% silicon dioxide. After the formation of the second electrode 104 and passivation layer 105, the sacrificial layer is etched away illustratively with hydrofluoric acid leaving the cantilevered portion 106.

As noted above, rather than air, the gap 108 may comprise other materials including low acoustic impedance materials, such as carbon (C) doped $SiO_2$, which is also referred as Black-diamond; or dielectric resin commercially known as SiLK™; or benzocyclobutene (BCB). Such low acoustic impedance materials may be provided in the gap 108 by known methods. The low acoustic impedance material may be provided after removal of sacrificial material used to form the gap 108, or may be used instead of the sacrificial material in the gap 108, and not removed.

The region of contacting overlap of the first and second electrodes 102, 104, the piezoelectric layer 103 and the acoustic mirror 107' is referred to as the active area 110 of the acoustic resonator 100'. By contrast, the inactive area of the acoustic resonator 100' comprises a region of overlap between first electrode 102 or second electrode 104, or both, and the piezoelectric layer 103 not disposed over the acoustic mirror 107'. As described more fully in the parent application, it is beneficial to the performance of the acoustic resonator 100' to reduce the area of the inactive region of the acoustic resonator 100' to the extent practical.

The cantilevered portion 106 extends beyond an edge of the active area 110 by a width 109 as shown. Electrical contact 111 is connected to a signal line (not shown) and electronic components (not shown) selected for the particular application of the acoustic resonator 100'. This portion of the acoustic resonator 100' comprises an interconnection side 112 of the acoustic resonator 100'. As will become clearer as the present description continues, the interconnection side 112 of the second electrode 104 to which the electrical contact 111 is made does not comprise a cantilevered portion 106. By contrast, one or more non-connecting sides of the acoustic resonator 100' may comprise cantilevered portions 106 that extend beyond the edge of the active area 110.

Figure 2A:
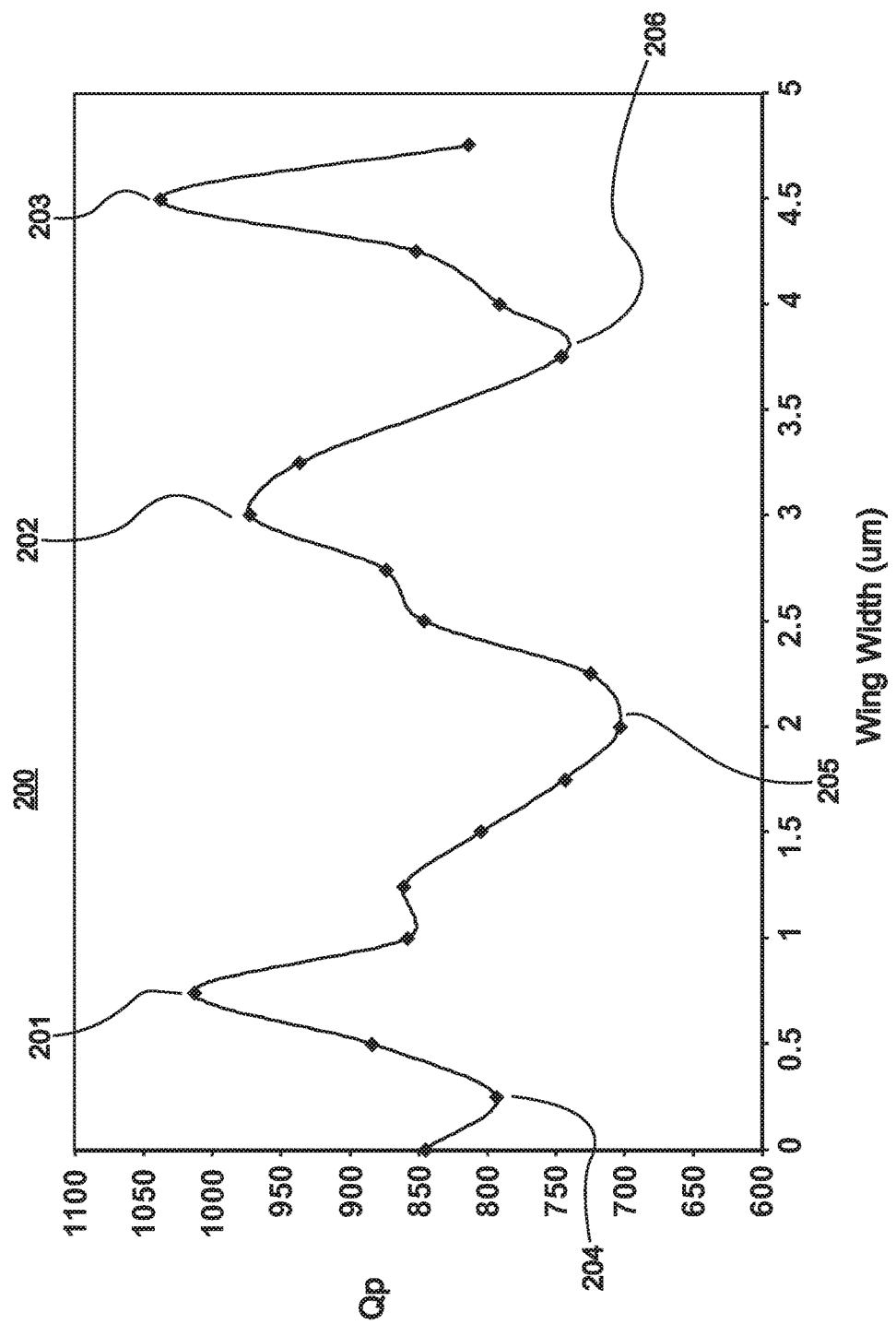
FIG. 2A shows a graph of the Q-factor at parallel resonance ($Q_p$) versus width of the cantilevered portion(s) of an acoustic resonator in accordance with a representative embodiment.

FIG. 2A shows a graph 200 of the Q-factor at parallel resonance ($Q_p$) versus width (e.g., width 109, also referred to as "wing width") of the cantilevered portion(s) 106 ("wings") of an acoustic resonator in accordance with a representative embodiment. The graph 200 provides data of an acoustic resonator comprising three cantilevered portions 106, such as illustratively shown in FIGS. 1A and 1B. The Q-factor is dependent on the width of the cantilevered portion 106 for a given parallel resonance frequency. As shown, there are relative maxima in $Q_p$ at points 201, 202 and 203; and local minima at points 204, 205 and 206 as the width 109 increases. Notably, $Q_p$ improves significantly at a certain width 109, compared with width 109 of the cantilevered portion 106 being zero, which is equivalent to an acoustic resonator having substantially the same structure as acoustic resonator 100 but not comprising the cantilevered portion 106.

Improvements in $Q_p$ due to the inclusion of the cantilevered portion 106 results from different boundary conditions at the edge of the active area 110 of the acoustic resonator 100 compared to an acoustic resonator not comprising a cantilevered portion(s). As described above, the cantilevered portion 106 at the edge of active area 110 of the acoustic resonator will reflect certain acoustic modes due to the impedance mismatch at the boundary of the cantilevered portion 106 and the active area 110, resulting in improved Q. It is believed that the local minima may result from the excitation of a mechanical resonance of the cantilevered portion 106, which results in losses. The excited resonance conditions at relative minima 204, 205, 206, result in energy not reflected back into the active area 110 of the acoustic resonator 100, losses and reduced Q. Accordingly, when designing acoustic resonator 100, the width 109 of the cantilevered portion 106 is beneficially selected at a relative maximum 201, 202, 203, and not at a relative minimum 204, 205, 206.

Figure 2B:
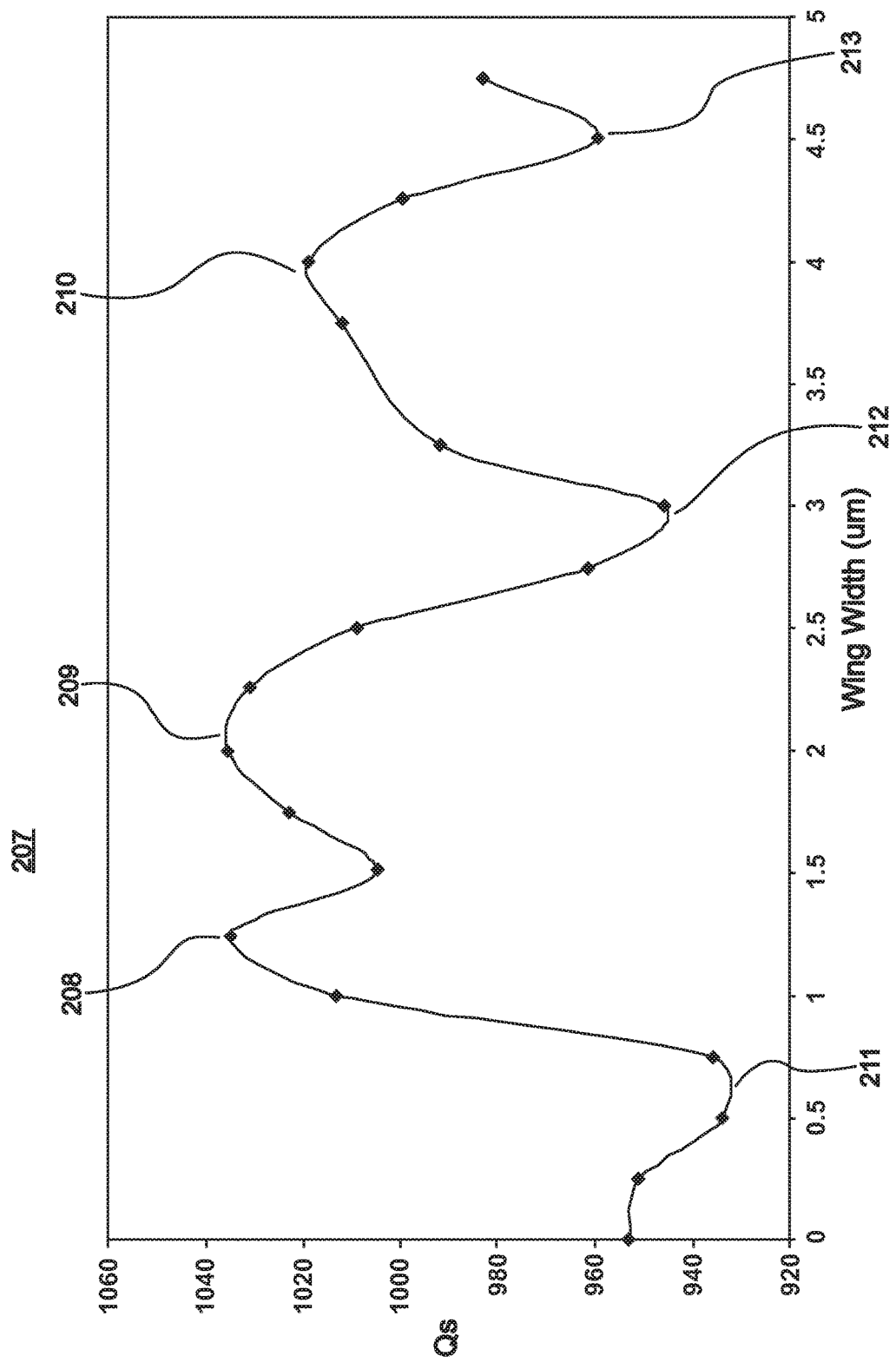
FIG. 2B shows a graph of the Q-factor at series resonance ($Q_s$) versus width of the cantilevered portion(s) of an acoustic resonator in accordance with a representative embodiment.

FIG. 2B shows a graph 207 of the Q-factor at series resonance ($Q_s$) versus width (e.g., width 109 ('wing width')) of the cantilevered portion 106 ('wing') of an acoustic resonator in accordance with a representative embodiment. The graph 207 provides data of an acoustic resonator comprising three cantilevered portions 106, such as illustratively shown in FIGS. 1A and 1B. The Q-factor is dependent on the width of the cantilevered portion 106 for a given series resonance frequency. As shown, there are relative maxima in $Q_s$ at points 208, 209 and 210; and local minima at points 211, 212 and 213 as the width 109 increases. Notably, $Q_s$ improves significantly at a certain width 109, compared with width=0 of the cantilevered portion 106, which is equivalent to an acoustic resonator having substantially the same configuration as acoustic resonator 100 but without cantilevered portions 106.

As described above, the cantilevered portion 106 at the edge of active area 110 of the acoustic resonator will reflect certain acoustic modes due to the impedance mismatch at the boundary of the cantilevered portion 106 and the active area 110, resulting in improved Q. It is believed that the local minima may result from the excitation of a mechanical resonance of the cantilevered portion 106, which results in losses. The excited resonance conditions at relative minima 211, 212 and 213 result in energy not reflected back into the active area 110 of the acoustic resonator 100, losses and, therefore, reduced Q. Accordingly, when designing acoustic resonator 100, the width 109 of the cantilevered portion 106 is beneficially selected at a relative maximum 208,209 or 210, and not at a relative minimum 211, 212 or 213.

Moreover, because the cantilevered portion 106 does not generate spurious lateral modes, there is no attendant degradation in Q near the series resonance frequency as can occur with the inclusion of known raised frame elements (sometimes referred to as 'outies') and known recessed frame elements (sometimes referred to as 'innies'.) Notably, both raised frame elements and recessed frame elements may be disposed annularly about acoustic resonator and are sometimes referred to as annular recesses and annular frames. The raised frame elements and recessed frame elements may generate spurious modes, but recessed frame elements improve the coupling coefficient ($k_t^2$), and raised frame elements may slightly decrease $k_t^2$. Furthermore the cantilevered portion 106 does not generate spurious modes because its location is not within the active area 110. The cantilevered portion 106 also does not degrade $k_t^2$ as significantly as the raised and recessed frame elements. As can be appreciated from a review of FIG. 2A, $k_t^2$ at peak Q corresponds to a width of the cantilevered portion 106 of approximately 4.75 µm is approximately 5.2. This represents an increase in $k_t^2$ of approximately 10% greater than that of a known acoustic resonator with a raised frame element.

Figure 3A:
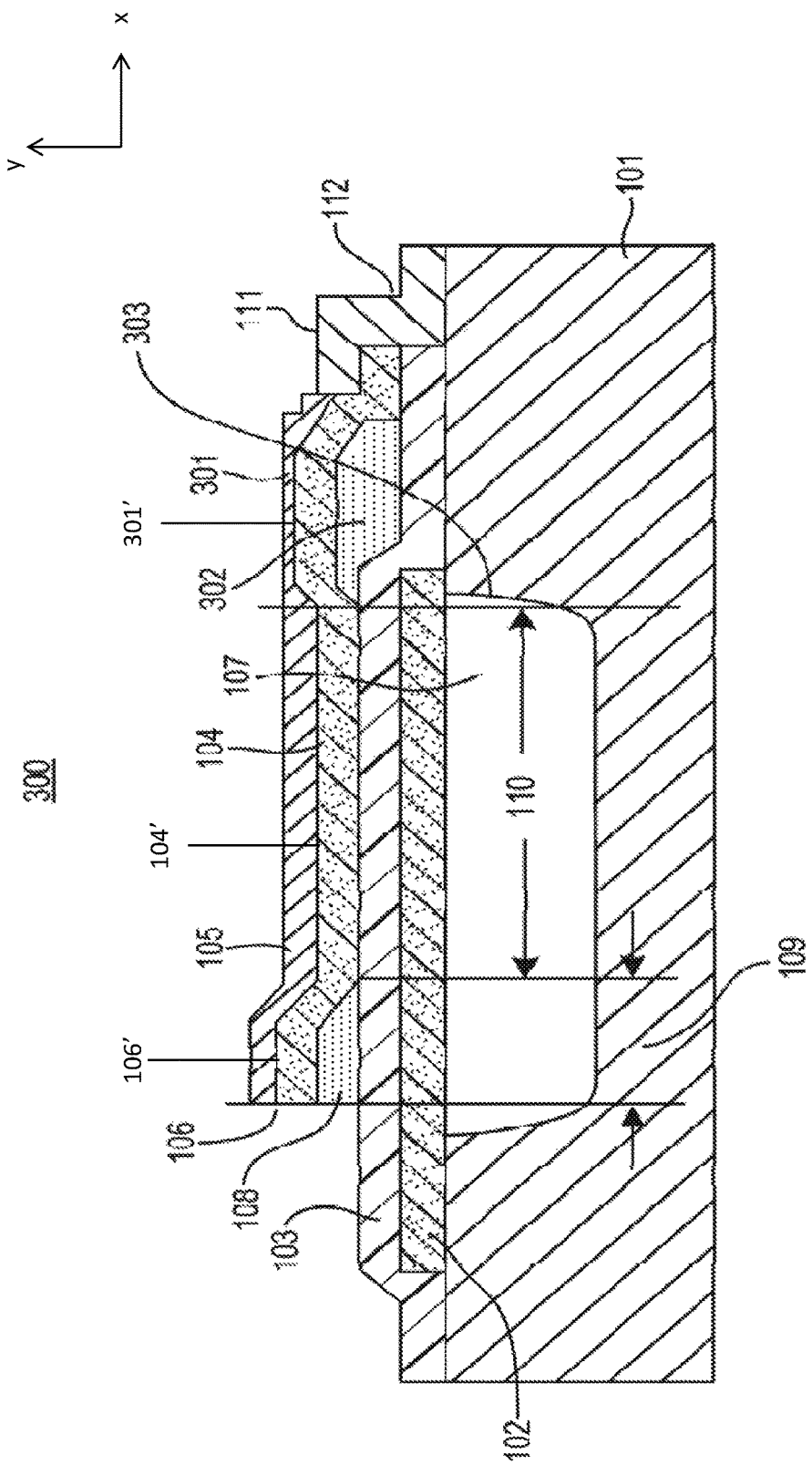
FIG. 3A shows a cross-sectional view of an acoustic resonator in accordance with a representative embodiment.

FIG. 3A shows a cross-sectional view of an acoustic resonator 300 in accordance with a representative embodiment. Many of the features of the acoustic resonator 300 are common to those of acoustic resonator 100 described in connection with representative embodiments in FIGS. 1A-1B. The details of common features, characteristics and benefits thereof are not repeated in order to avoid obscuring the presently described embodiments.

The acoustic resonator 300 comprises a bridge 301 along the interconnection side 112. The bridge 301 provides a gap 302, which may be a void (e.g., air) or may be filled with a low acoustic impedance material. The bridge 301 is described in the parent application (now U.S. Pat. No. 8,248,185), and as such many of the details of the bridge 301 are not repeated in the present application to avoid obscuring the description of the representative embodiments of the acoustic resonator 300. As depicted in FIG. 3A, the cavity 107 has an edge 303, and the bridge 301 extends past the edge 303 of the cavity 107 (or similar reflective element, such as a mismatched Bragg reflector) and over the substrate 101. As such, in a representative embodiment, the bridge 301 is disposed partially over the cavity 107, extends over the edge 303 of the cavity 107, and is disposed partially over the substrate 101.

As depicted in FIG. 3A, the second electrode 104 comprises the first surface 104' disposed substantially at the first height (y-dimension in the coordinate system depicted). The bridge 301 comprises a third surface 301'. The third surface 301' is disposed substantially at a third height (again, y-dimension in the coordinate system depicted). The third height is higher than the first height. Thus, the third surface 301' is raised up relative to the first surface 104'.

As described above, the cantilevered portion 106 provides an improvement in the Q-factor. Similarly, the bridge 301 also provides an improvement in the Q-factor. Beneficially, the combination of the cantilevered portion 106 and the bridge 301 provides a further improvement in the Q-factor of the acoustic resonator 300. To this end, inclusion of the bridge 301 with the cantilevered portion 106 in the acoustic resonator 300 results in an improvement in the Q-factor at parallel resonance (Qp) and some impact on the Q-factor at series resonance (Qs). This is somewhat expected since the bridge 301 predominantly impacts Qp, as described in the parent application.

Figure 3B:
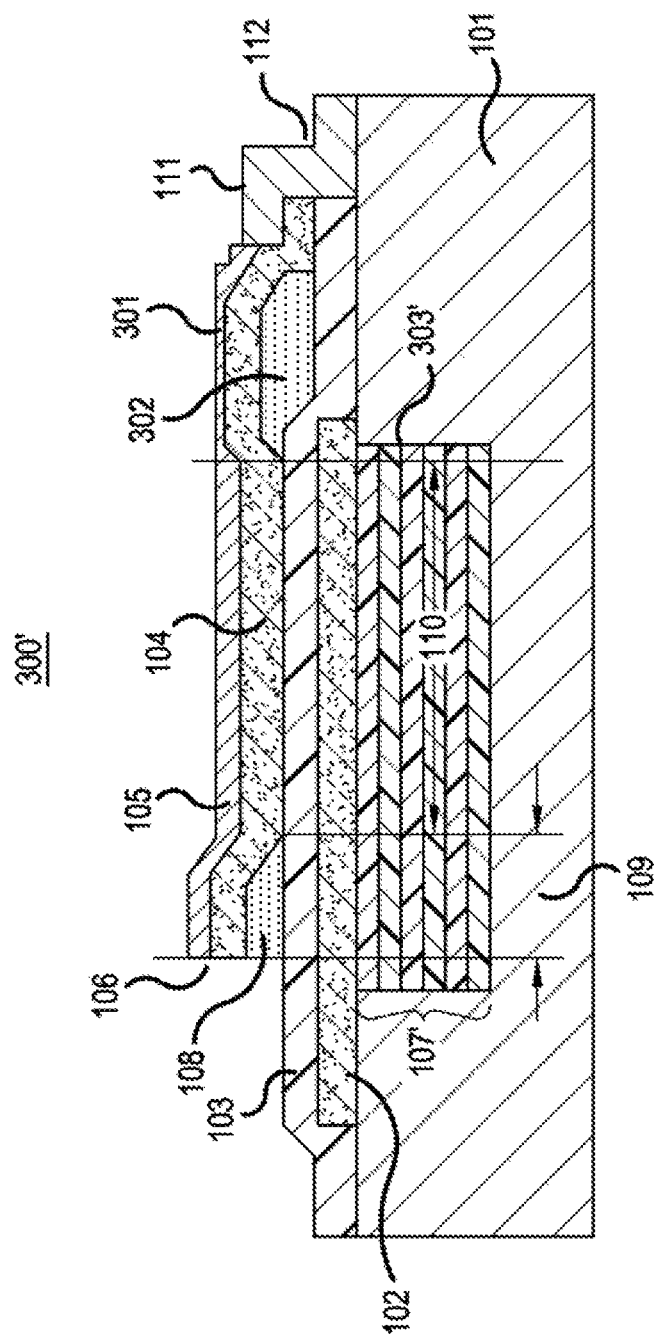
FIG. 3B shows a cross-sectional view of an acoustic resonator in accordance with a representative embodiment.

FIG. 3B shows a cross-sectional view of an acoustic resonator 300' in accordance with a representative embodiment. Many of the features of the acoustic resonator 300' are common to those of acoustic resonator 100', 300 described in connection with representative embodiments in FIGS. 1C and 3A. The details of common features, characteristics and benefits thereof are not repeated in order to avoid obscuring the presently described embodiments.

The acoustic resonator 300' comprises bridge 301 along the interconnection side 112. The bridge 301 provides a gap 302, which may be a void (e.g., air) or may be filled with a low acoustic impedance material. The bridge 301 is described in the parent application (now U.S. Pat. No. 8,248,185), and as such many of the details of the bridge 301 are not repeated in the present application to avoid obscuring the description of the representative embodiments of the acoustic resonator 300. As depicted in FIG. 3B, the acoustic mirror 107' has an edge 303', and the bridge 301 extends past the edge 303' of the acoustic mirror 107' and over the substrate 101. As such, in a representative embodiment, the bridge 301 is disposed partially over the acoustic mirror 107', extends over the edge 303' of the acoustic mirror 107', and is disposed partially over the substrate 101.

As described above, the cantilevered portion 106 provides an improvement in the Q-factor. Similarly, the bridge 301 also provides an improvement in the Q-factor. Beneficially, the combination of the cantilevered portion 106 and the bridge 301 provides a further improvement in the Q-factor of the acoustic resonator 300'. To this end, inclusion of the bridge 301 with the cantilevered portion 106 in the acoustic resonator 300' results in an improvement in the Q-factor at parallel resonance (Qp) and some impact on the Q-factor at series resonance (Qs). This is somewhat expected since the bridge 301 predominantly impacts Qp, as described in the parent application.

Figure 4A:
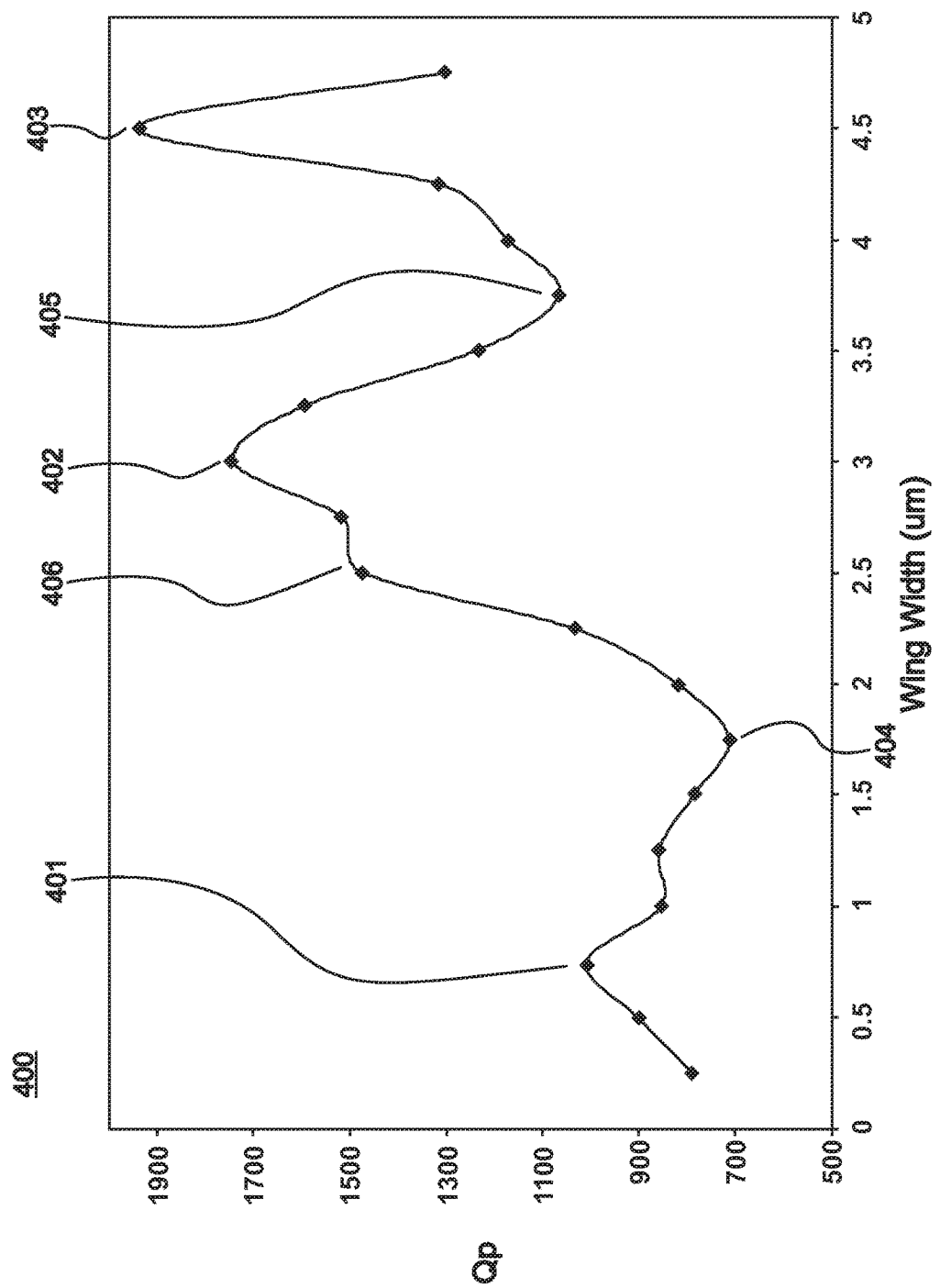
FIG. 4A shows a graph of the Q-factor at parallel resonance ($Q_p$) versus width of the cantilevered portion(s) of an acoustic resonator in accordance with a representative embodiment.

FIG. 4A shows a graph 400 of the Q-factor at parallel resonance (Qp) versus width (e.g., width 109, ('wing width')) of the cantilevered portion 106 of an acoustic resonator comprising a bridge (e.g., acoustic resonator 300) in accordance with a representative embodiment. The graph 400 provides data of an acoustic resonator comprising three cantilevered portions 106, such as illustratively shown in FIGS. 1A and 1B. The Q-factor is dependent on the wing width for a given parallel resonance frequency. As shown, there are relative maxima in $Q_p$ at points 401, 402 and 403; and relative minima at points 404 and 405 as the width 109 increases. Notably, $Q_p$ improves significantly at a certain width 109, compared with width=0 of the cantilevered portion 106, which is equivalent to an acoustic resonator having substantially the same configuration shown in FIG. 3 but without cantilevered portions 106.

The synergistic impact of the combination of the bridge 301 and the cantilevered portions 106 on Qp can be appreciated by a comparison of data in FIGS. 2A and 4A. For example, in an embodiment comprising cantilevered portion 106 having a width (e.g., width 109) of approximately 2.5 µm, Qp in FIG. 2A (near point 201, for example) is approximately 850. By contrast, in an embodiment comprising bridge 301 and cantilevered portion 106 having a width of approximately 2.5 µm (e.g., near point 406) provides Qp of approximately 1500. Similarly, in an embodiment comprising cantilevered portion 106 having a width (e.g., width 109) of approximately 3.0 µm, Qp in FIG. 2A (near point 202, for example) is approximately 975. By contrast, in an embodiment comprising bridge 301 and cantilevered portion 106 having a width of approximately 3.0 µm provides Qp of approximately 1750 (e.g., point 402 in FIG. 4A).

Figure 4B:
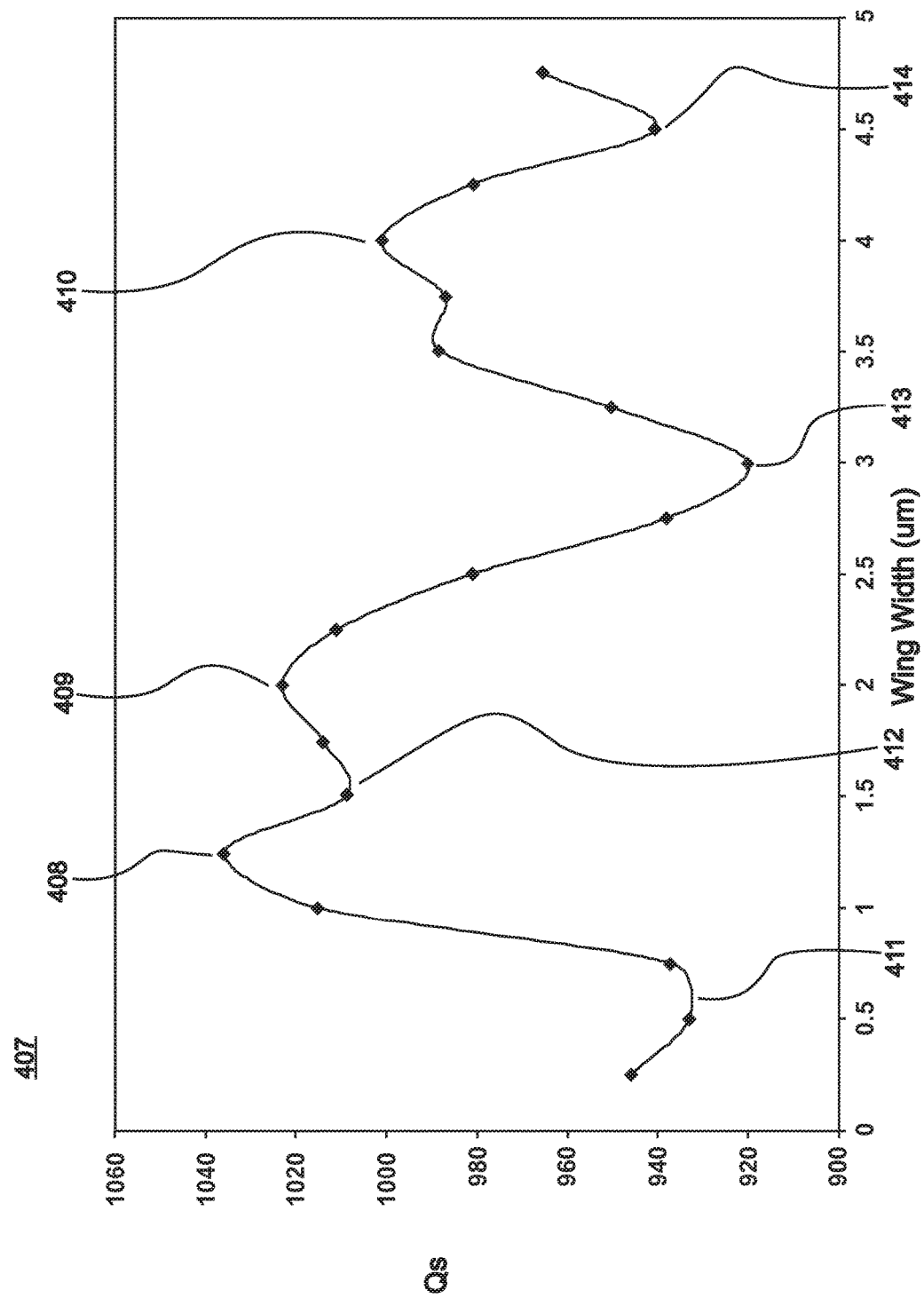
FIG. 4B shows a graph of the Q-factor at series resonance ($Q_s$) versus width of the cantilevered portion(s) of an acoustic resonator in accordance with a representative embodiment.

FIG. 4B shows a graph 407 of the Q-factor at series resonance ($Q_s$) versus width (e.g., width 109) of the cantilevered portion 106 of an acoustic resonator comprising a bridge (e.g., acoustic resonator 300) in accordance with a representative embodiment. The graph 407 provides data of an acoustic resonator comprising three cantilevered portions 106, such as illustratively shown in FIGS. 1A and 1B. The Q-factor is dependent on the wing width for a given series resonance frequency. As shown, there are relative maxima in $Q_p$ at points 408, 409 and 410; and relative minima at points 411, 412, 413 and 414 as the width 109 increases. Notably, $Q_s$ improves significantly at a certain width 109, compared with width=0 of the cantilevered portion 106, which is equivalent to an acoustic resonator having substantially the same configuration shown in FIG. 3 but without cantilevered portions 106. As note previously, the impact of the bridge 301 on improved $Q_s$ is less dramatic than its impact on $Q_p$.

Figure 4C:
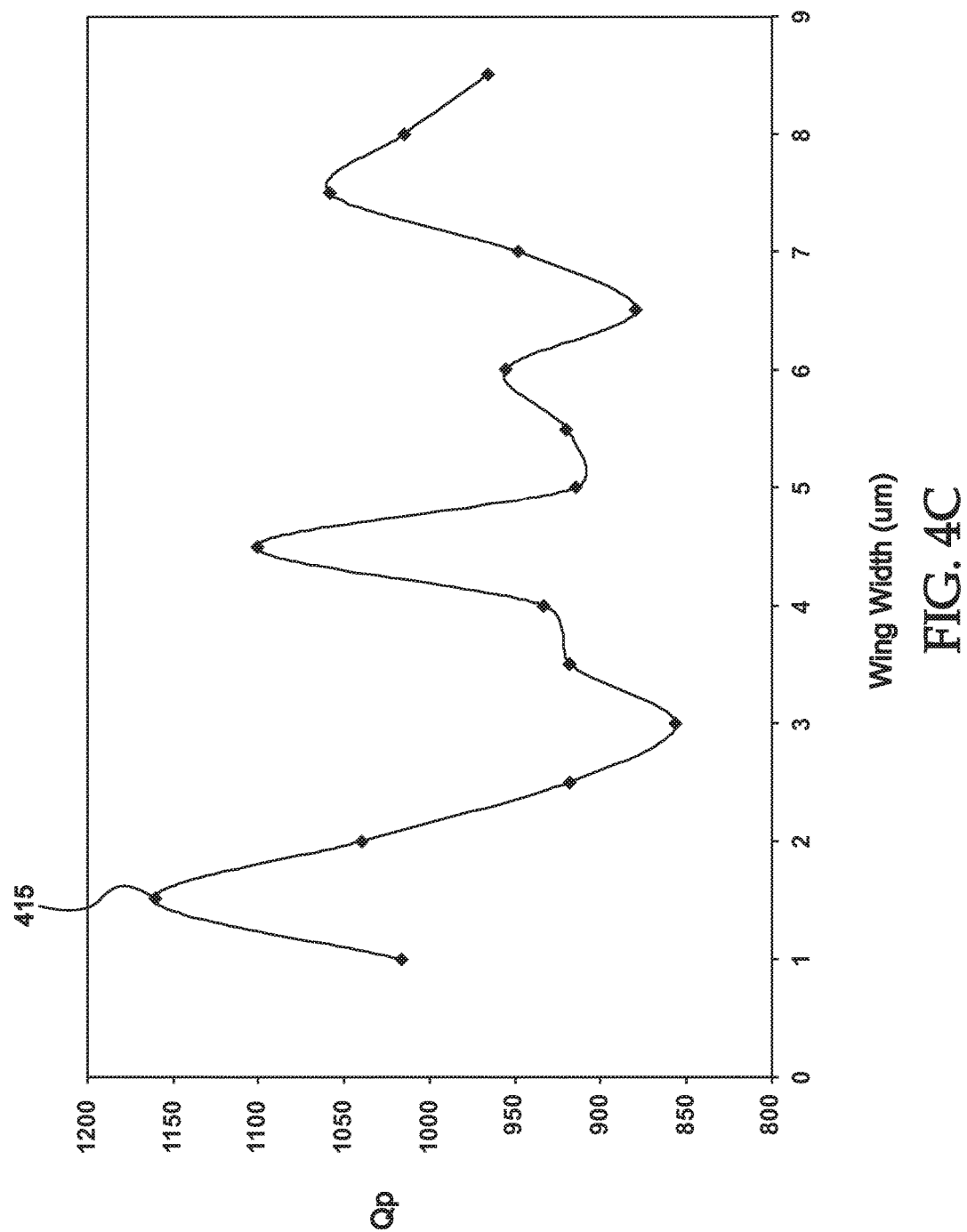
FIG. 4C shows a graph of the Q-factor at parallel resonance ($Q_p$) versus width of the cantilevered portion(s) of an acoustic resonator in accordance with a representative embodiment.

FIG. 4C shows a graph of the Q-factor at parallel resonance ($Q_p$) versus width of the cantilevered portion(s) of an acoustic resonator in accordance with a representative embodiment. As the total thickness of the acoustic stack decreases, the resonance frequency increases and, therefore, the acoustic wavelength at the resonance frequency decreases. An optimum width 109 ('wing width') of the cantilevered portion 106, at which the most Q enhancement is achieved, is determined by resonance acoustic quarter-wavelength, therefore smaller optimum wing width is required to achieve optimum Q, Notably, FIG. 4C relates to an acoustic resonator having a parallel resonance of 800 MHz. A maximum Q-value (shown at point 415) is attained at a wing width of approximately 1.6 µm.

Figure 5A:
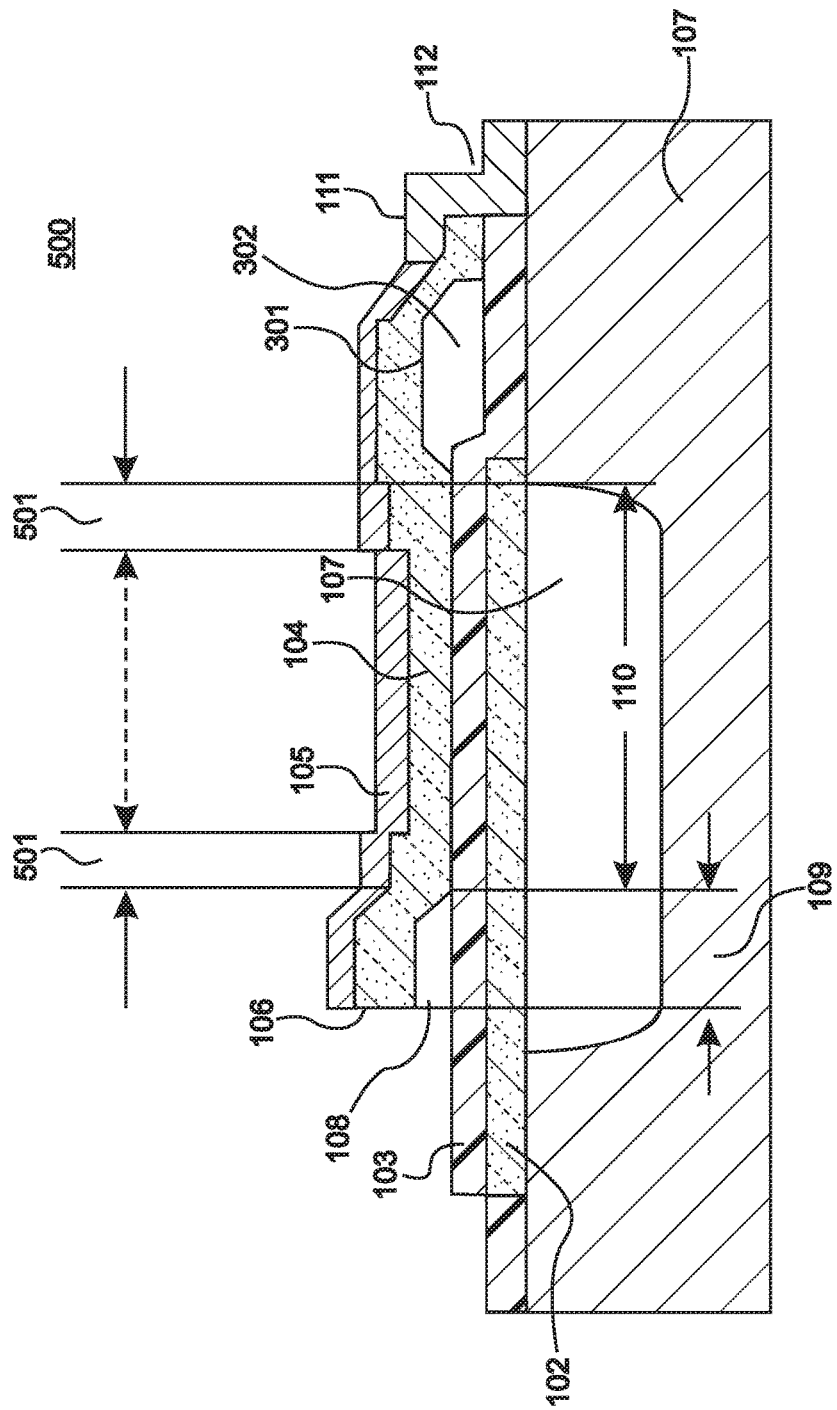
FIG. 5A shows a cross-sectional view of an acoustic resonator in accordance with a representative embodiment taken along line 5A-5A in FIG. 5B.
Figure 5B:
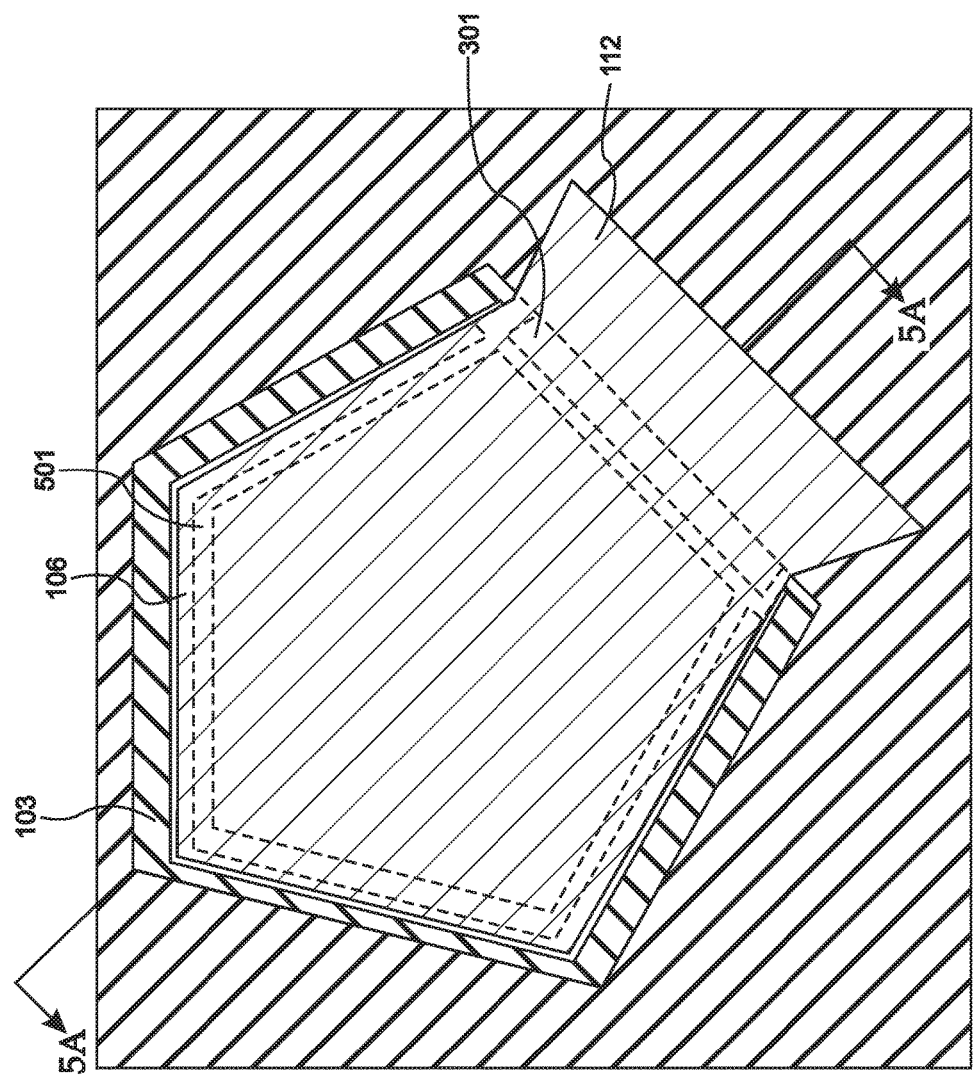
FIG. 5B shows a top view of an acoustic resonator in accordance with a representative embodiment.

FIG. 5A shows a cross-sectional view of an acoustic resonator 500 taken along line 5B-5B in accordance with a representative embodiment. FIG. 5B shows a top view of the acoustic resonator 500. Many of the features of the acoustic resonator 500 are common to those of acoustic resonators 100, 300 described in connection with representative embodiments in FIGS. 1A-1B and 3. The details of common features, characteristics and benefits thereof are not repeated in order to avoid obscuring the presently described embodiments.

The acoustic resonator 500 comprises the bridge 301 along the interconnection side 112. The bridge 301 provides the gap 302, which may be a void (e.g., air) or may be filled with a low acoustic impedance material. In addition to the bridge 301, the acoustic resonator 500 comprises a raised frame element 501 (commonly referred to as an 'outie'). The raised frame element 501 may be provided over one or more sides of the acoustic resonator 500 and provides an acoustic mismatch at the boundary of the second electrode 104, thereby improving signal reflections at the boundary and reducing acoustic losses. Ultimately, reduced losses translate into an improved Q-factor of the device. While the raised frame element 501 are shown disposed over the second electrode 104, these features may instead be provided over the first electrode 102 and beneath the piezoelectric layer 103, or selectively on both the first and second electrodes 102,104. Further details of the use, formation and benefits of the raised frame element 501 may be found for example, in commonly owned U.S. Pat. No. 7,280,007 entitled "Thin Film Bulk Acoustic Resonator with a Mass Loaded Perimeter" to Feng, et al.; and commonly owned U.S. Patent Application Publication 20070205850 entitled "Piezoelectric Resonator Structure and Electronic Filters having Frame Elements" to Jamneala, et al. The disclosures of this patent and patent application publication are specifically incorporated herein by reference.

The raised frame element 501 results in an increase in the parallel impedance (Rp) but generates spurious modes below the series resonance frequency; whereas the cantilevered portion 106 increases Rp without degrading Qs. This is because the area of the raised frame element 501 represents a comparatively small fraction of the active area of the acoustic resonator 500. It can be shown that this is equivalent to an acoustic resonator connected in parallel to an acoustic resonator comprising a frame element. Since the resonance frequency of an acoustic resonator comprising the raised frame element 501 is lower, spurious modes are generated below $f_s$ of the acoustic resonator without the frame element. The addition of the cantilevered portion 106 to the acoustic resonator 500 comprising the raised frame element 501 further increases Rp without resulting in additional spurious modes below $f_s$ because the wing 106 lies outside of the active area 110 of the acoustic resonator 500.

Figure 6:
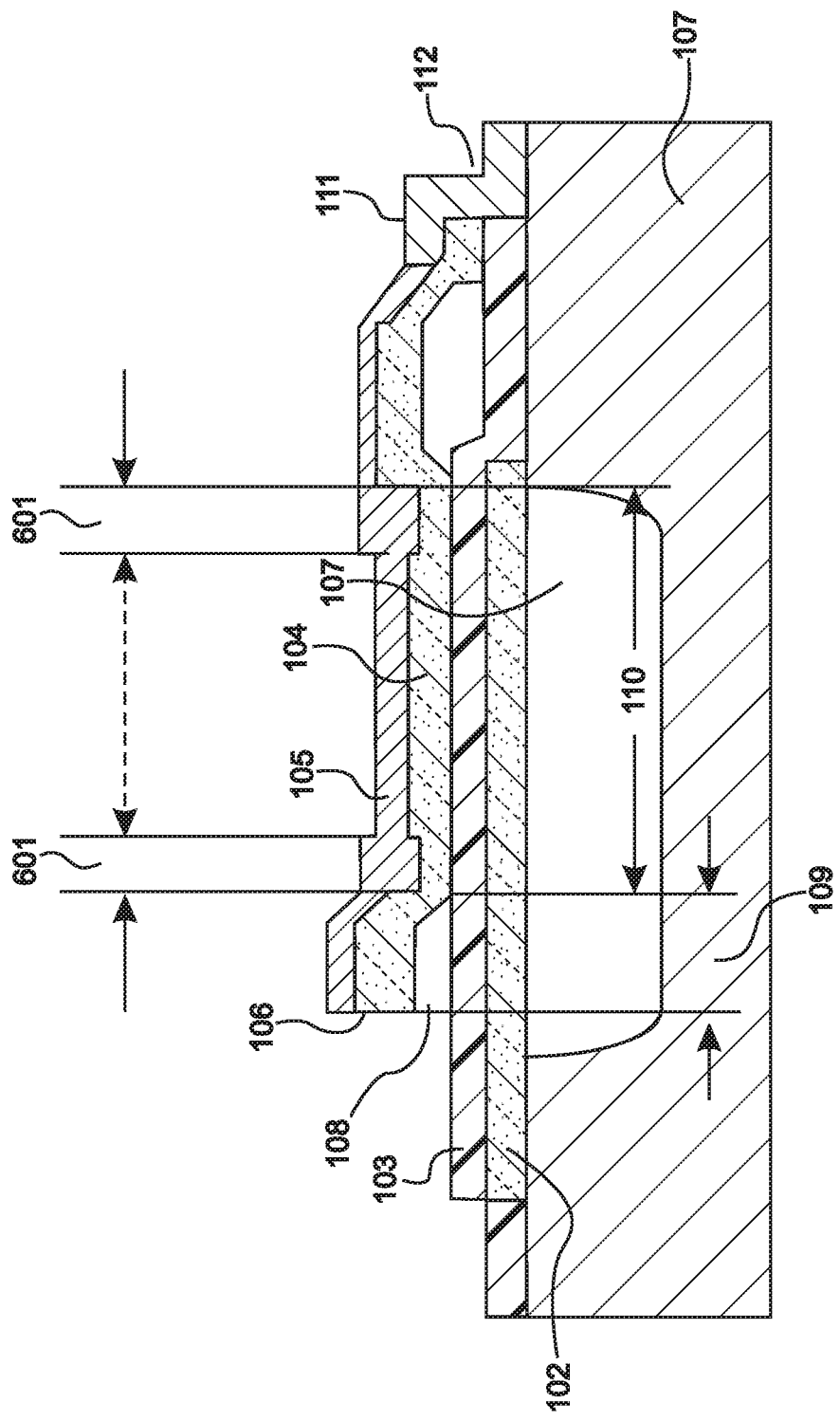
FIG. 6 shows a cross-sectional view of an acoustic resonator in accordance with a representative embodiment.

FIG. 6 shows a cross-sectional view of an acoustic resonator 600 in accordance with a representative embodiment. Many of the features of the acoustic resonator 600 are common to those of acoustic resonators 100, 300, 500 described in connection with representative embodiments in FIGS. 1A-1B, 3, 5A and 5B. The details of common features, characteristics and benefits thereof are not repeated in order to avoid obscuring the presently described embodiments.

The acoustic resonator 600 comprises the bridge 301 along the interconnection side 112. The bridge 301 provides the gap 302, which may be a void (e.g., air) or may be filled with a low acoustic impedance material. In addition to the bridge 301, the acoustic resonator 600 comprises a recessed frame element 601 ('innie'). The recessed frame element 601 may be disposed along one or more sides of the acoustic resonator 600 and provides an acoustic mismatch at the perimeter of the second electrode 104, thereby improving signal reflections and reducing acoustic losses. Ultimately, reduced losses translate into an improved Q-factor of the device. While the recessed frame element 601 is shown disposed over the second electrode 104, the recessed frame element 601 may instead be provided over the first electrode 102 and beneath the piezoelectric layer 103, or selectively on both the first and second electrodes 102,104. Further details of the use, formation and benefits of the recessed frame element 601 may be found for example, in commonly owned U.S. Pat. No. 7,280,007 entitled "Thin Film Bulk Acoustic Resonator with a Mass Loaded Perimeter" to Feng, et al.; and commonly owned U.S. Patent Application Publication 20070205850 entitled "Piezoelectric Resonator Structure and Electronic Filters having Frame Elements" to Jamneala, et al. The disclosures of this patent and patent application publication are specifically incorporated herein by reference. Moreover, the incorporation of both a raised frame element (e.g., raised frame element 501) and a recessed frame (e.g., recessed frame element 601) in an acoustic resonator 100, 300, 500, 600 is also contemplated by the present teachings. The incorporation of both raised and recessed frame elements in an acoustic resonator is disclosed in the parent application (U.S. patent application Ser. No. 12/490,525).

Figure 7:
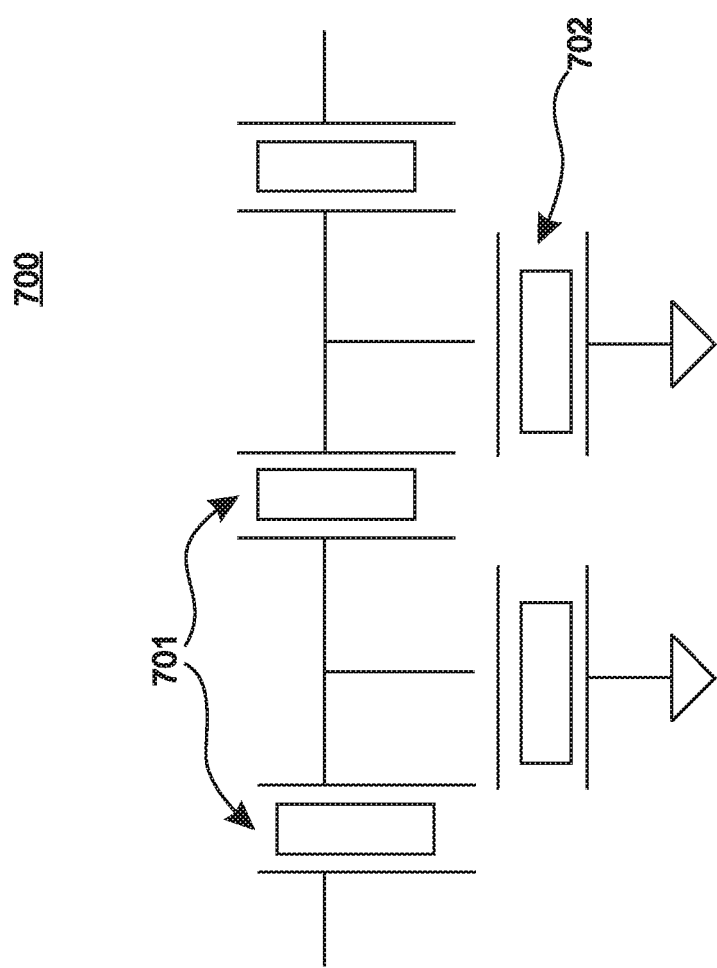
FIG. 7 shows a simplified schematic diagram of an electrical filter in accordance with a representative embodiment.

When connected in a selected topology, a plurality of acoustic resonators 100, 300, 500, 600 can function as an electrical filter. FIG. 7 shows a simplified schematic block diagram of an electrical filter 700 in accordance with a representative embodiment. The electrical filter 700 comprises series acoustic resonators 701 and shunt acoustic resonators 702. The series acoustic resonators 701 and shunt acoustic resonators 702 may comprise the acoustic resonators 100, 300, 500, 600 described in connection with the representative embodiments of FIGS. 1A, 1B, 3, 5A, 5B and 6. The electrical filter 700 is commonly referred to as a ladder filter, and may be used for example in duplexer applications. Further details of a ladder-filter arrangement may be as described for example in U.S. Pat. No. 5,910,756 to Ella, and U.S. Pat. No. 6,262,637 to Bradley, et al. The disclosures of these patents are specifically incorporated by reference. It is emphasized that the topology of the electrical filter 700 is merely illustrative and other topologies are contemplated. Moreover, the acoustic resonators of the representative embodiments are contemplated in a variety of applications besides duplexers.

In accordance with illustrative embodiments, acoustic resonators for various applications such as in electrical filters are described having an electrode comprising a cantilevered portion. Additionally, acoustic resonators for various applications such as in electrical filters are described having an electrode comprising a cantilevered portion and a bridge. One of ordinary skill in the art appreciates that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

We claim:

1. An acoustic resonator, comprising:
a first electrode;
a second electrode comprising a plurality of sides, wherein at least one of the sides comprises a cantilevered portion, wherein the second electrode comprises a first surface disposed substantially at a first height, and the cantilevered portion comprises a second surface disposed substantially at a second height, which is higher than the first height;
a piezoelectric layer disposed between the first and second electrodes, the cantilevered portion extending above the piezoelectric layer, wherein a first gap exists between the cantilevered portion and the piezoelectric layer, and the first gap is substantially filled with a low acoustic impedance material; and
a bridge comprising a second gap, which exists in a region between the second electrode and the piezoelectric layer, wherein the second gap is substantially filled with the low acoustic impedance material, and is disposed adjacent to one of the sides of the second electrode.

2. The acoustic resonator as claimed in claim 1, further comprising a reflective element disposed beneath the first electrode, the second electrode and the piezoelectric layer, wherein a contacting overlap of the reflective element, the first electrode, the second electrode and the piezoelectric layer comprises an active area of the acoustic resonator, and the bridge is disposed adjacent to the active area of the acoustic resonator.

3. The acoustic resonator as claimed in claim 2, wherein the cantilevered portion of the second electrode extends beyond a termination of the active area.

4. The acoustic resonator as claimed in claim 1, wherein all but one of the plurality of sides of the second electrode comprises the cantilevered portion.

5. The acoustic resonator as claimed in claim 4, further comprising an electrical connection to the one of the plurality of sides of the second electrode that does not comprise the cantilevered portion.

6. An acoustic resonator, comprising:
a first electrode;
a second electrode comprising a plurality of sides, wherein at least one of the sides comprises a cantilevered portion, wherein the second electrode comprises a first surface disposed substantially at a first height, and the cantilevered portion comprises a second surface disposed substantially at a second height, which is higher than the first height;
a piezoelectric layer disposed between the first and second electrodes, the cantilevered portion extending above the piezoelectric layer, wherein a first gap exists between the cantilevered portion and the piezoelectric layer, and the first gap is substantially filled with a low acoustic impedance material;
a bridge comprising a second gap in a region between the second electrode and the piezoelectric layer, wherein the second gap is substantially filled with the low acoustic impedance material, and is disposed adjacent to one of the sides of the second electrode;
a reflective element disposed beneath the first electrode, the second electrode and the piezoelectric layer, wherein a contacting overlap of the reflective element, the first electrode, the second electrode and the piezoelectric layer comprises an active area of the acoustic resonator, and the bridge is disposed adjacent to the active area of the acoustic resonator; and a frame element.

7. The acoustic resonator as claimed in claim 6, wherein the frame element is a recessed frame element.

8. The acoustic resonator claimed in claim 6, wherein the frame element comprises a raised frame element.

9. The acoustic resonator claimed in claim 6, wherein the low acoustic impedance material is one of carbon (C) doped silicon dioxide ($SiO_2$), SiLK™ dielectric resin, or benzocyclobutene (BCB).

10. The acoustic resonator as claimed in claim 6, further comprising:

a reflective element beneath the first electrode, the second electrode and the piezoelectric layer, wherein a contacting overlap of the reflective element, the first electrode, the second electrode and the piezoelectric layer comprises an active area of the acoustic resonator, and the bridge is disposed adjacent to the active area of the acoustic resonator.

11. The acoustic resonator as claimed in claim 10, wherein the cantilevered portion of the second electrode extends beyond a termination of the active area.

12. The acoustic resonator as claimed in claim 6, wherein all but one of the plurality of sides of the second electrode comprises the cantilevered portion.

13. The acoustic resonator as claimed in claim 12, further comprising an electrical connection to the one of the plurality of sides of the second electrode that does not comprise the cantilevered portion.

14. An acoustic resonator, comprising:

a first electrode;

a second electrode comprising a plurality of sides, wherein at least one of the sides comprises a cantilevered portion, wherein the second electrode comprises a first surface disposed substantially at a first height, and the cantilevered portion comprises a second surface disposed substantially at a second height, which is higher than the first height;

a piezoelectric layer disposed between the first and second electrodes, the cantilevered portion extending above the piezoelectric layer, wherein a first gap exists between the cantilevered portion and the piezoelectric layer, and the first gap is substantially filled with a low acoustic impedance material; and a bridge comprising a second gap in a region between the second electrode and the piezoelectric layer, wherein the second gap is substantially filled with the low acoustic impedance material, and is disposed adjacent to one of the sides of the second electrode, wherein the low acoustic impedance material is one of carbon (C) doped silicon dioxide ($SiO_2$), SiLK™ dielectric resin, or benzocyclobutene (BCB).

15. The acoustic resonator as claimed in claim 14, further comprising:

a reflective element beneath the first electrode, the second electrode and the piezoelectric layer, wherein a contacting overlap of the reflective element, the first electrode, the second electrode and the piezoelectric layer comprises an active area of the acoustic resonator, and the bridge is disposed adjacent to the active area of the acoustic resonator.

16. The acoustic resonator as claimed in claim 15, wherein the cantilevered portion of the second electrode extends beyond a termination of the active area.

17. The acoustic resonator as claimed in claim 14, further comprising a recessed frame element.

18. The acoustic resonator claimed in claim 14, further comprising a raised frame element.

19. The acoustic resonator as claimed in claim 14, wherein all but one of the plurality of sides of the second electrode comprises the cantilevered portion.

20. The acoustic resonator as claimed in claim 19, further comprising an electrical connection to the one of the plurality of sides of the second electrode that does not comprise the cantilevered portion.

* * * * *

UNITED STATES PATENT AND TRADEMARK OFFICE
CERTIFICATE OF CORRECTION

PATENT NO. : 10,461,719 B2
APPLICATION NO. : 15/371920
DATED : October 29, 2019
INVENTOR(S) : John Choy, Chris Feng and Phil Nikkel It is certified that error appears in the above-identified patent and that said Letters Patent is hereby corrected as shown below:

On the Title Page

Item (73), REPLACE "Avago Technologies General IP (Singapore) Pte. Ltd." with "Avago Technologies International Sales Pte. Limited"

Signed and Sealed this
Twenty-fifth Day of February, 2020

Andrei Iancu
*Director of the United States Patent and Trademark Office*